United States Patent [19]
Parkin

[11] Patent Number: 6,153,320
[45] Date of Patent: Nov. 28, 2000

[54] MAGNETIC DEVICES WITH LAMINATED FERROMAGNETIC STRUCTURES FORMED WITH IMPROVED ANTIFERROMAGNETICALLY COUPLING FILMS

[75] Inventor: Stuart Stephen Papworth Parkin, San Jose, Calif.

[73] Assignee: International Business Machines Corporation, Armonk, N.Y.

[21] Appl. No.: 09/305,842

[22] Filed: May 5, 1999

[51] Int. Cl.$^7$ .................................. B32B 9/00; G11B 5/66
[52] U.S. Cl. ........................ 428/693; 427/131; 427/132; 428/617; 428/618; 428/619; 428/621; 428/629; 428/632; 428/637; 428/640; 428/651; 428/652; 428/667; 428/671; 428/675; 428/676; 428/679; 428/682; 428/694 TM; 428/697; 428/699; 428/900; 428/928
[58] Field of Search ........................... 428/694 TM, 697, 428/699, 900, 928, 617, 618, 619, 621, 629, 632, 637, 640, 651, 652, 667, 671, 676, 675, 679, 682, 693; 427/131, 132

[56] References Cited

U.S. PATENT DOCUMENTS

| | | | |
|---|---|---|---|
| 5,206,590 | 4/1993 | Dieny et al. | 324/252 |
| 5,341,118 | 8/1994 | Parkin et al. | 338/32 |
| 5,408,377 | 4/1995 | Gurney et al. | 360/113 |
| 5,465,185 | 11/1995 | Heim et al. | 360/113 |
| 5,552,949 | 9/1996 | Hashimoto et al. . | |
| 5,650,887 | 7/1997 | Dovek et al. | 360/75 |
| 5,841,692 | 11/1998 | Gallagher et al. | 365/173 |

OTHER PUBLICATIONS

S. S. P. Parkin et al., "Oscillations in Exchange Coupling and Magnetoresistance in Metallic Superlattice Structures: Co/Ru, Co/Cr, and Fe/Cr", Physical Review Letters, vol. 64, No. 19, May 7, 1990, 2304–2307.

S. S. P. Parkin, "Systematic Variation of the Strength and Oscillation Period of Indirect Magnetic Exchange Coupling through the 3d, 4d, and 5d Transition Metals", Physical Review Letters, vol. 67, No. 25, Dec. 16, 1991, pp. 3598–3601.

P.J.H. Bloemen et al., "Interlayer coupling in Co/Os multi-layers" Journal of Magnetism and Magnetic Materials, 121 (1993), pp. 306–308.

S. S. P. Parkin et al., "Oscillatory Exchange Coupling and Giant Magnetoresistance via Cu–X Alloys (X=Au, Fe, Ni)", Europhysics Letters, 24 (1), 1993, pp. 71–76.

M. van Schilfgaarde et al, "Theory of Oscillatory Exchange Coupling in Fe/(V,Cr) and Fe/(Cr,Mn)", Physical Review Letters, vol. 74, No. 20, May 15, 1995, pp. 4063–4066.

S. S. P. Parkin, "Spin Engineering: Direct determination of the Ruderman–Kittel–Kasuya–Yosida far–field range function in ruthenium", Physical Review B, vol. 44, No. 13, Oct. 1, 1991, pp. 7131–7134.

*Primary Examiner*—Bernard Pianalto
*Attorney, Agent, or Firm*—Thomas R. Berthold

[57] ABSTRACT

A magnetic device uses laminated ferromagnetic layers containing antiferromagnetically coupled ferromagnetic films coupled together with improved antiferromagnetically coupling (AFC) films. The AFC films are formed of the binary and ternary alloys comprising combinations of Ru, Os and Re. The ferromagnetic film thicknesses, the AFC film thicknesses and the compositions of the films in the laminated layer can be varied to engineer the magnetic properties of the device. The magnetic devices whose properties are improved with the improved laminated layers include spin valve magnetoresistive read heads and magnetic tunnel junction (MTJ) devices for use as magnetic memory cells and magnetoresistive read heads.

7 Claims, 5 Drawing Sheets

MAGNETIC DEVICES WITH LAMINATED FERROMAGNETIC STRUCTURES FORMED WITH IMPROVED ANTIFERROMAGNETICALLY COUPLING FILMS

RELATED APPLICATION

This application is related to IBM's pending application Ser. No. 09/238,714 filed Jan. 28, 1999, U.S. Pat. No. 5,505,394.

TECHNICAL FIELD

This invention relates to magnetic devices, such as magnetoresistive read heads based on the giant magnetoresistance (GMR) effect, and magnetic tunnel junction (MTJ) devices for use as magnetic memory cells and magnetoresistive read heads.

BACKGROUND OF THE INVENTION

One type of a GMR read head is a sandwich structure comprising two uncoupled ferromagnetic layers separated by a nonmagnetic metallic electrically conducting spacer layer, typically copper (Cu), in which the magnetization direction (magnetic moment) of one of the ferromagnetic layers is fixed or pinned, while the magnetization direction of the free or sensing ferromagnetic layer is free to rotate. This type of GMR device is referred to as a spin valve magnetoresistive sensor in which only the free or sensing ferromagnetic layer is free to rotate in the presence of an external magnetic field in the range of interest for the sensor. The basic spin valve magnetoresistive sensor is described in IBM's U.S. Pat. No. 5,206,590.

A magnetic tunnel junction (MTJ) device has two ferromagnetic layers separated by a nonmagnetic electrically insulating layer, called the tunnel barrier layer, which is typically formed of alumina. One of the ferromagnetic layers is a pinned layer whose magnetization direction is oriented in the plane of the layer but is fixed or pinned so as not to be able to rotate in the presence of an applied magnetic field. The pinned ferromagnetic layer may be pinned by interface exchange biasing with an adjacent antiferromagnetic layer, while the free ferromagnetic layer has its magnetization direction capable of rotation relative to the pinned layer's magnetization direction. The tunneling current that flows perpendicularly through the insulating tunnel barrier layer depends on the relative magnetization directions of the two ferromagnetic layers. MTJ devices have applications for use as memory cells in magnetic memory arrays and as magnetoresistive read heads in magnetic recording devices.

The spin valve magnetoresistive sensor has been improved by substitution of one or both of the free and pinned ferromagnetic layers with a laminated layer comprising two ferromagnetic films antiferromagnetically coupled to one another in an antiparallel orientation by a antiferromagnetically coupling (AFC) film. This laminated structure is magnetically rigid so that when used as the free ferromagnetic layer the two antiparallel films rotate together. These improved spin valve sensors are described in IBM's U.S. Pat. Nos. 5,408,377 and 5,465,185, which are incorporated herein by reference. The MTJ device has also been improved by substitution of this type of laminated layer for the pinned layer, as described in IBM's U.S. Pat. No. 5,841,692, which is incorporated herein by reference.

This type of laminated structure is based upon the discovery of the oscillatory coupling relationship for selected material combinations of ferromagnetic films and metallic AFC films, as described in detail by S. S. P. Parkin et al., Phys Rev. Lett., Vol. 64, p. 2034 (1990). The sign and strength of the interlayer coupling for thin AFC films is important for these laminated structures. Of all the transition metal materials ruthenium (Ru) was shown to be the most useful for obtaining strong antiferromagnetic coupling in the limit of very thin AFC films. Ru displays very strong antiferromagnetic coupling between cobalt (Co), cobalt-iron (Co—Fe) and nickel-iron (Ni—Fe) ferromagnetic films even when just ~3 Å thick. This makes Ru very useful to form pairs of antiparallel oriented ferromagnetic films, which are useful for a variety of applications to reduce the net magnetic moment of the ferromagnetic layer, for example, as described in the above-cited patents relating to spin valve magnetoresistive sensors and MTJ devices. It is also useful for many applications that the thickness of the AFC film be thin, either because this takes up less space, or because the AFC film must not significantly increase the conductance of the laminated layer. Thus Ru is particularly useful, because it is both very thin and of relatively high resistivity. By contrast, Cu is not as useful because it must be significantly thicker in order to obtain antiferromagnetic coupling and is one of the most conducting elements.

It has also been shown that the magnitude of the interlayer coupling increases with increasing number of d electrons (i.e. for elements varied across the periodic table from left to right) and is systematically higher for 5 d than for 4 d and for 4 d than for 3 d elements (i.e. for elements varied along a column in the periodic table from bottom to top). Moreover, it has also been shown that the strength of the interlayer coupling decreases with increasing AFC film thickness. See "Systematic Variation of the Strength and Oscillation Period of Indirect Magnetic Exchange Coupling through the 3 d, 4 d, and 5 d Transition Metals", S.S.P. Parkin, Phys Rev. Lett., Vol. 67, pp. 3598–3601 (1991). Thus Ru is especially useful because it gives rise to very strong antiferromagnetic coupling both because it exhibits antiferromagnetic coupling for very thin layers and also because of its position in the Periodic Table of elements. Finally, Ru is especially useful because it exhibits strong antiferromagnetic coupling and oscillatory interlayer coupling for a wide range of ferromagnetic materials. By contrast, rhodium (Rh), which would appear to exhibit nominally higher interlayer coupling strengths when its oscillatory behavior is extrapolated to very thin Rh layers, is actually ferromagnetic at ~3 Å and generally requires AFC films ~7–8 Å thick for antiferromagnetic coupling. In addition, Rh is more conducting than Ru and the magnetic properties of the laminated layer containing the Rh AFC film are much more sensitive to the material of which the ferromagnetic films are formed.

While Ru has many attractive properties, including large antiferromagnetic coupling for very thin Ru layers, for certain applications the antiferromagnetic coupling strength is too large. For spin valve magnetoresistive heads it is very useful to form the exchange biased pinned ferromagnetic layer as this type of laminated layer with a Ru AFC film, as described in the '185 patent. This reduces the net magnetic moment of the pinned ferromagnetic layer (in magnetic fields below the field required to saturate the magnetic moments of the two ferromagnetic films forming the laminated pinned layer) so that the magnetostatic field which the free ferromagnetic layer is subjected to is reduced. In addition, the reduced magnetic moment of the pinned ferromagnetic layer makes the exchange coupling field exhibited by the antiferromagnet on the pinned layer considerably larger. Thus the use of this laminated pinned layer makes this layer magnetically more stable against magnetic fields, especially at higher temperatures. However, the antiferromagnetic coupling strength provided by thin Ru AFC films is so large that it is difficult to saturate the magnetic moment of the laminated pinned layer without applying very large magnetic fields of the order of 10–20 kOe. In a manufacturing environment when devices are formed from films deposited on large area substrates (typically circular or square substrates 5–8 inches in diameter or width) it is very difficult and expensive to build a magnet powerful enough to give a uniform magnetic field ~10–20 kOe in strength across such large areas. It is also necessary to reset the direction of the exchange bias field in a manufacturing environment during processing of the heads. Moreover, it is also sometimes useful to be able to reset the direction of the exchange pinning of the pinned ferromagnetic layer in an operating spin valve (or MTJ) head, as described for example in IBM's U.S. Pat. No. 5,650,887. For Ru antiferromagnetic coupling layers, very large magnetic fields must be applied to reset the exchange bias field either for large wafers during processing or in spin valve heads during their operation.

What is needed is a magnetic device where one or more of the ferromagnetic layers is a laminated antiferromagnetically coupled layer having an AFC film formed of material which is no more conducting than Ru yet which gives lower and variable antiferromagnetic coupling strengths.

SUMMARY OF THE INVENTION

The invention is a magnetic device with laminated ferromagnetic layers containing antiferromagnetically coupled ferromagnetic films coupled together with improved AFC films. The AFC films are formed of the binary and ternary alloys comprising combinations of Ru, Os and Re. The ferromagnetic film thicknesses, the AFC film thicknesses and the compositions of the films can be varied to engineer magnetic properties of the magnetic device. The magnetic devices whose properties are improved with the improved laminated layers include spin valve magnetoresistive read heads and MTJ devices for use as magnetic memory cells and magnetoresistive read heads.

For a fuller understanding of the nature and advantages of the present invention, reference should be made to the following detailed description taken together with the accompanying figures.

DETAILED DESCRIPTION OF THE INVENTION

Prior Art Spin Valve Magnetoresistive Sensor

Figure 1:
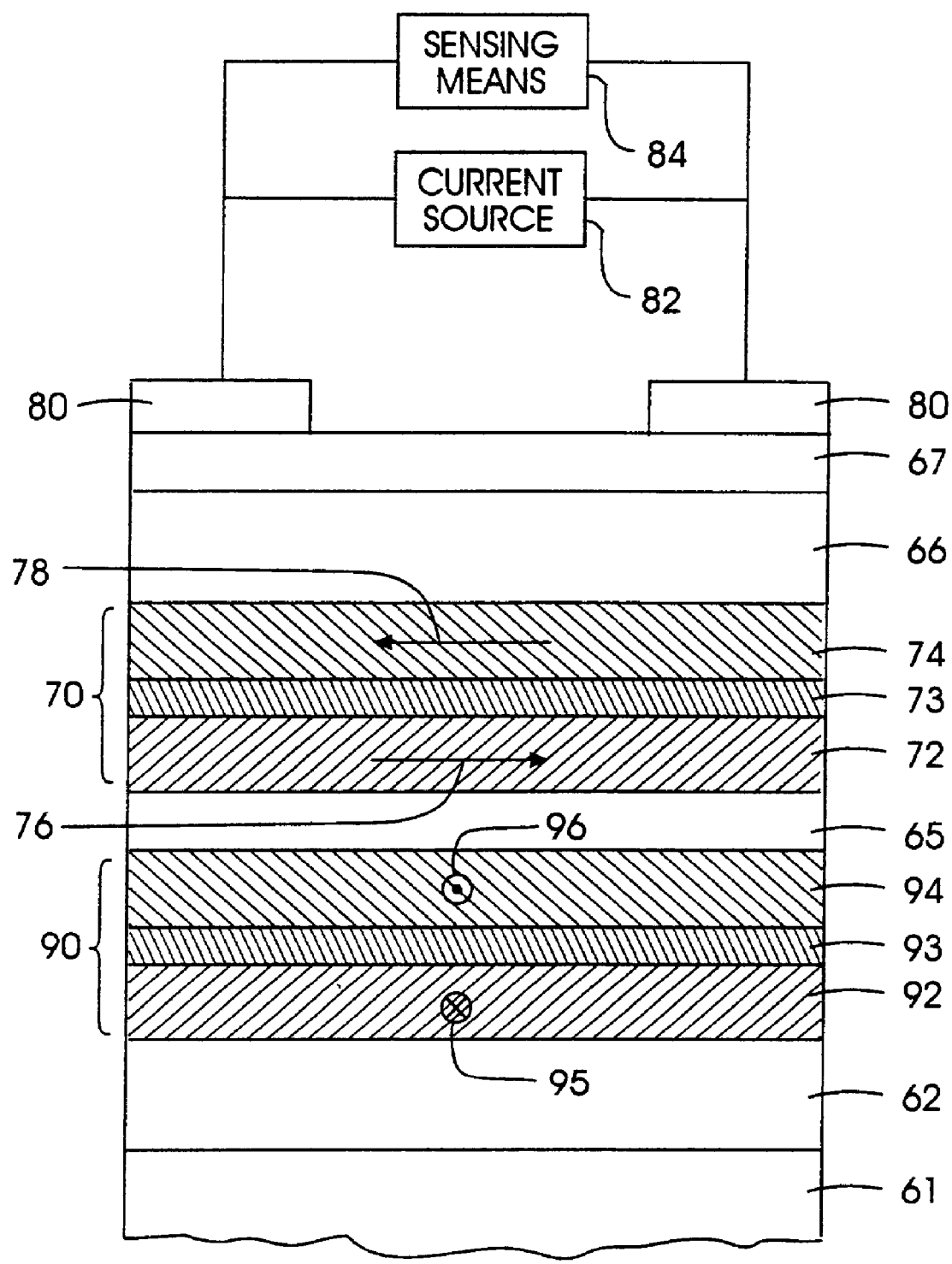
FIG. 1 is a schematic of a prior art spin valve magnetoresistive sensor with laminated antiferromagnetically coupled free and pinned ferromagnetic layers.

The spin valve magnetoresistive sensor with laminated antiferromagnetically coupled ferromagnetic films as both the free and pinned ferromagnetic layers is shown schematically in FIG. 1. The structure has a 70 Å film of tantalum (Ta) as a buffer layer 62 formed onto a substrate 61. The laminated free ferromagnetic layer 90 comprises ferromagnetic $Ni_{81}Fe_{19}$, (permalloy) films 92, 94 separated by a Ru AFC film 93. Ferromagnetic films 92, 94 have their magnetic moments aligned antiparallel, as shown respectively by arrow 95 into the paper and arrow 96 out of the paper. A Cu layer 65 is deposited onto the free layer 90 to a thickness of 27 Å to serve as the nonferromagnetic metallic spacer layer for the spin valve structure. While Cu is shown, other nonferromagnetic metallic materials with high electrical conductivity, such as silver (Ag), gold (Au), and their alloys, can be used. The pinned ferromagnetic layer 70 is also a laminated structure that comprises a first $Ni_{81}Fe_{19}$ film 72 having a thickness of 30 Å directly on the Cu spacer layer 65, a 5 Å Ru AFC film 73 deposited onto the first film 72, and a second $Ni_{81}Fe_{19}$, film 74 of 30 Å thickness formed on the Ru AFC film 73. The two pinned ferromagnetic films 72, 74 are deposited in the presence of an applied magnetic field rotated approximately 90 degrees from the field applied during the deposition of the free ferromagnetic layer 90. An iron-manganese (Fe—Mn) film 66 of 90 Å thickness is deposited on the second film 74 to exchange couple with the second film 74. Other suitable antiferromagnetic layers include Ir—Mn, Pt—Mn, Pd—Mn and Ni—Mn. Finally, a capping layer 67 of 25 Å of Ru is formed over the Fe—Mn film 66. Other suitable capping materials are high resistivity materials, such as Ta, zirconium (Zr), alloys of Cu and Au, or various oxides FIG. 1 also illustrates schematically the means for connecting the sensor to sensing circuitry in the magnetic recording system. Electrical leads 80 are provided to form a circuit path between the sensor and a current source 82 and a sensing means 84. As is well known in the art, additional sensor elements, such as transverse and longitudinal bias layers (not shown), may be required to provide an optimal sensor response circuit. In the preferred embodiment, a magnetic signal in the recording medium is sensed by the sensing means 84 detecting the change in resistance of the sensor as the magnetization direction of the laminated free ferromagnetic layer 90 rotates relative to the fixed magnetization direction of the laminated pinned ferromagnetic layer 70 in response to the applied magnetic signal from the recorded medium.

The two films 72, 74 in the laminated pinned layer 70 have magnetization directions indicated by arrows 76, 78, respectively. The antiparallel alignment of the moments of the two films 72, 74 is due to the antiferromagnetic coupling through the Ru AFC film 73. Because of this antiferromagnetic coupling, and because the two films 72, 74 have substantially the same thickness, the magnetic moments of each of the films cancel each other so that there is essentially no net magnetic moment in the laminated pinned layer 70. Thus, there is essentially no magnetic dipole field generated by the pinned layer 70, and thus no magnetic field to affect the direction of the net magnetic moment of the laminated free ferromagnetic layer 90.

Prior Art MTJ Device

Figure 2:
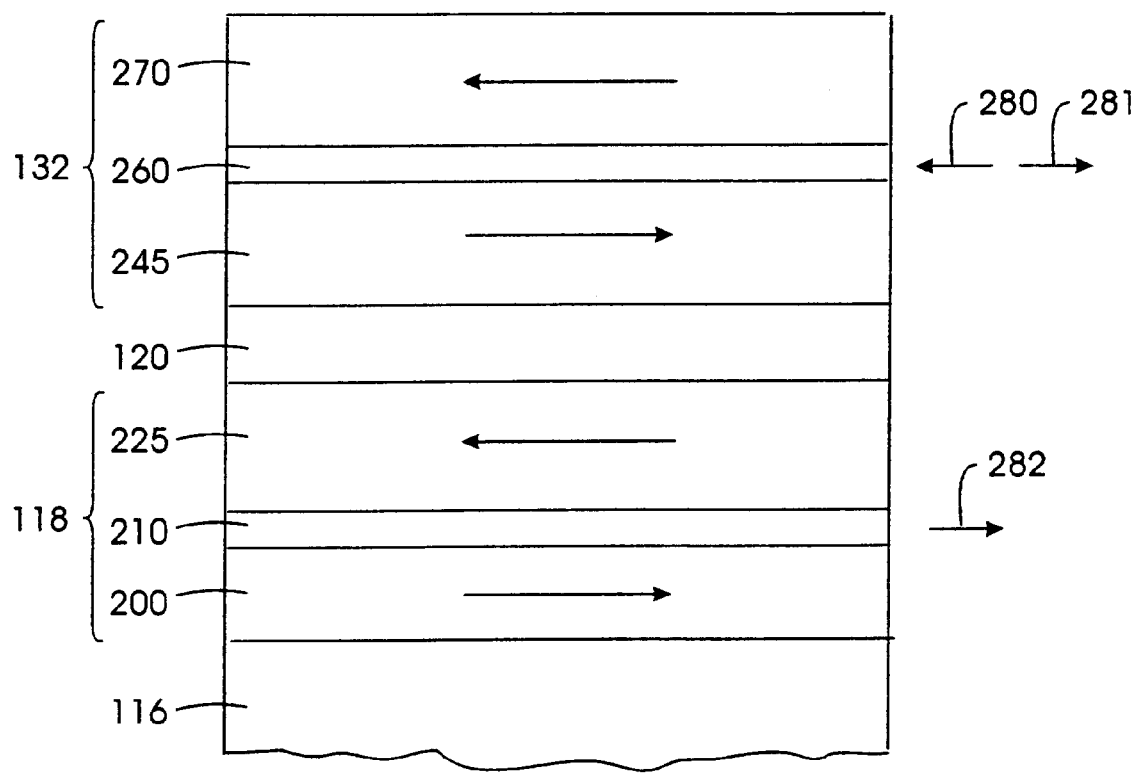
FIG. 2 is a schematic of a prior art magnetic tunnel junction device with laminated antiferromagnetically coupled free and pinned ferromagnetic layers.

A MTJ device is shown in FIG. 2. A laminated fixed ferromagnetic layer 118 is comprised of a sandwich of two ferromagnetic films 200 and 225 separated by a nonferromagnetic Ru AFC film 210 which couples the ferromagnetic films 200 and 225 antiferromagnetically such that the magnetic moments of films 200 and 225 are arranged antiparallel to one another. The two ferromagnetic films 200 and 225 in the laminated fixed ferromagnetic layer 118 have magnetic moments that are antiparallel due to the antiferromagnetic exchange coupling through the antiferromagnetically coupling film 210. Because of this antiferromagnetic coupling, and because the two ferromagnetic films 200, 225 can be made to have substantially the same thickness, the magnetic moments of each of the films essentially cancel each other so that there is essentially no net magnetic moment in the fixed ferromagnetic layer 118. Thus, there is essentially no magnetic dipole field generated by the fixed ferromagnetic layer 118, and thus no magnetic field to affect the direction of magnetization of the free or sensing ferromagnetic layer 132. Because it is not possible to precisely form each of the films to the exact same thickness, the net moment of the fixed ferromagnetic layer 118 will likely be a small but nonzero value as a natural result of the normal deposition process. The lower ferromagnetic film 200 is deposited on the antiferromagnetic exchange layer 116, which provides exchange biasing for film 200 so that the moment of film 200 is prevented from rotation in the presence of a magnetic field in the range of interest. Because film 225 is antiferromagnetically coupled to film 200 it too is prevented from rotation.

Similarly the free ferromagnetic layer 132 is comprised of two ferromagnetic films 245 and 270 separated by a thin nonferromagnetic AFC film 260 which couples the moments of films 245 and 270 antiferromagnetically.

In the MTJ device of FIG. 2, the laminated fixed 118 and free 132 ferromagnetic layers are separated by the nonmagnetic spacer 120, which is the insulating tunnel barrier layer, typically formed of alumina. When the MTJ device is used as a magnetoresistive recording head, the magnetic moments of the ferromagnetic films making up the fixed and free ferromagnetic layers will have the orientations as shown in FIG. 1 for the spin valve GMR head. However, when the MTJ device is used as a magnetic memory cell, the moments of the ferromagnetic films in each of the laminated ferromagnetic layers 118, 132 will be aligned antiparallel with one another, but the moments of the free ferromagnetic films 245, 270 will rotate together as a rigid unit so that the net moment of free ferromagnetic layer 132 will be either parallel (arrow 280) or antiparallel (arrow 281) to the net moment (arrow 282) of the fixed ferromagnetic layer 118.

Preferred Embodiments

Figure 3:
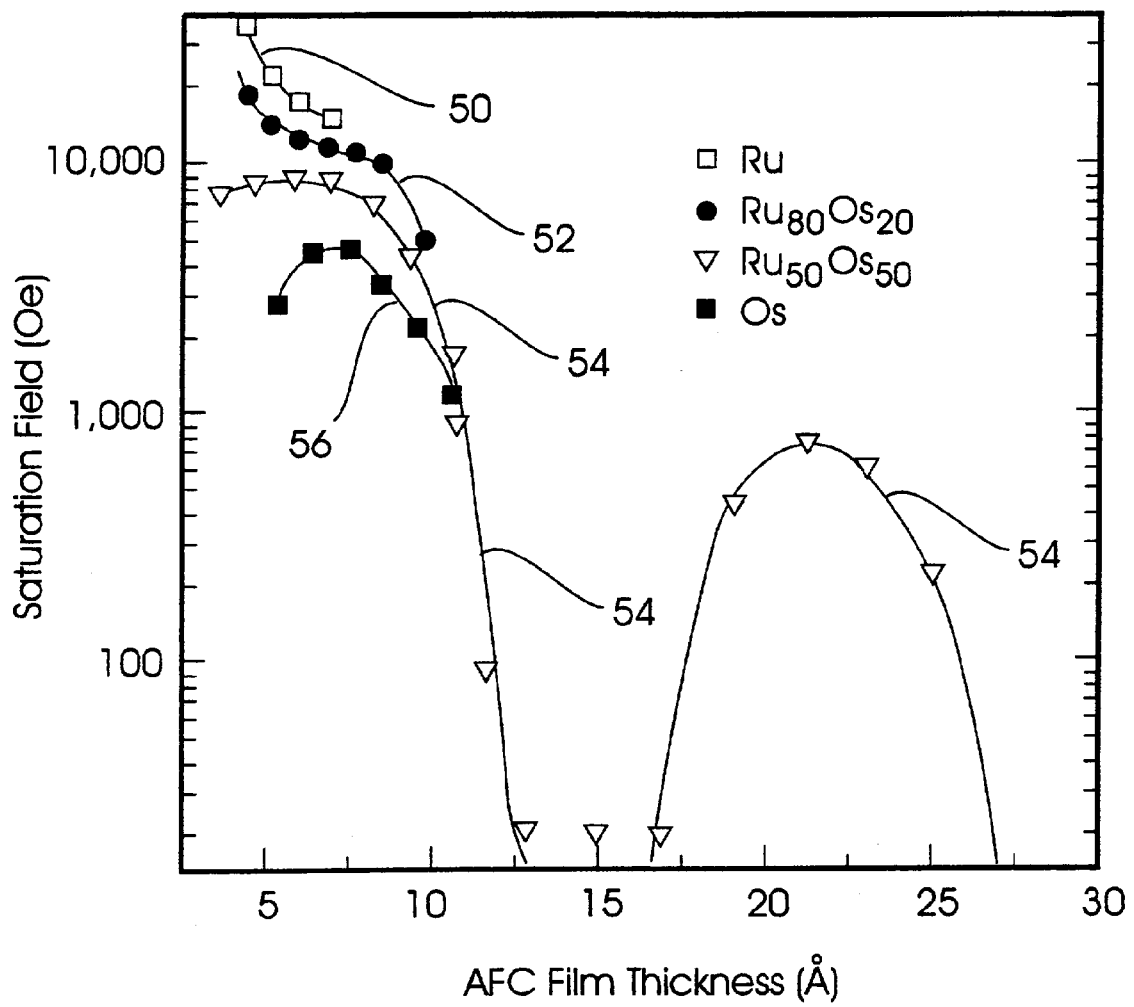
FIG. 3 is a graph of magnetization saturation field versus AFC film thicknesses for laminated structures with Co ferromagnetic films and Ru and Ru–Os AFC films with varying amounts of Os.

FIG. 3 is a graph of the saturation field, $H_s$, versus AFC film thickness for laminated magnetic structures comprised of multiple thin Co ferromagnetic layers ~20 Å thick with multiple $Ru_{100-x}Os_x$ AFC films, where x=0, 20, 50 and 100 atomic percent. The magnetic saturation field is the field that is needed to fully orient the magnetic moments of the ferromagnetic films comprising the laminated structure along the applied field direction. This field is approximately proportional to the strength of the antiferromagnetic coupling of the films by the AFC films. When the coupling between the ferromagnetic films is close to zero, the saturation field is determined by the intrinsic magnetic properties of the ferromagnetic films themselves. Referring to curve 54, the saturation field versus AFC film thickness for the magnetic structures with $Ru_{50}Os_{50}$ AFC films oscillates with a frequency of 10 to 12 Angstroms. In curve 54 the saturation field values are large and positive for magnetic structures with AFC films of $Ru_{50}Os_{50}$ and with thicknesses between approximately 17 and 27 Angstroms. The saturation field values are small and close to zero for these magnetic structures with AFC film thicknesses between approximately 17 and 12 Angstroms. Then, between 2 to 12 Angstroms thickness, the saturation field values are large and positive again. The ranges of AFC film thicknesses where there are saturation fields significantly greater than the intrinsic saturation field of the ferromagnetic layers themselves are the corresponding thicknesses of AFC films that produce antiferromagnetic coupling between the ferromagnetic layers. The oscillating saturation field with varying AFC film thicknesses is observed in all laminated layers with thin (2–100 Angstroms) Os, Ru, and rhenium (Re) AFC films. Again referring to FIG. 3, the saturation field values decrease with increasing percentage of Os alloyed with Ru, as seen by the isometric reduction in curve area going from curves 50, 52, 54 and 56. The saturation field values are directly proportional to the antiferromagnetic coupling strengths as discussed above, although in these multilayered structures with many ferromagnetic and many AFC films the antiferromagnetic coupling energy derived from the magnetization saturation field is exactly two times smaller than that for a single laminated layer. This is because in a multilayer structure with many ferromagnetic and AFC films each ferromagnetic film is coupled to two neighboring ferromagnetic films via its two adjacent AFC films and thereby requires approximately two times the field to saturate its magnetization, as compared to a single laminated structure of two ferromagnetic films and a single AFC film.

Figure 4:
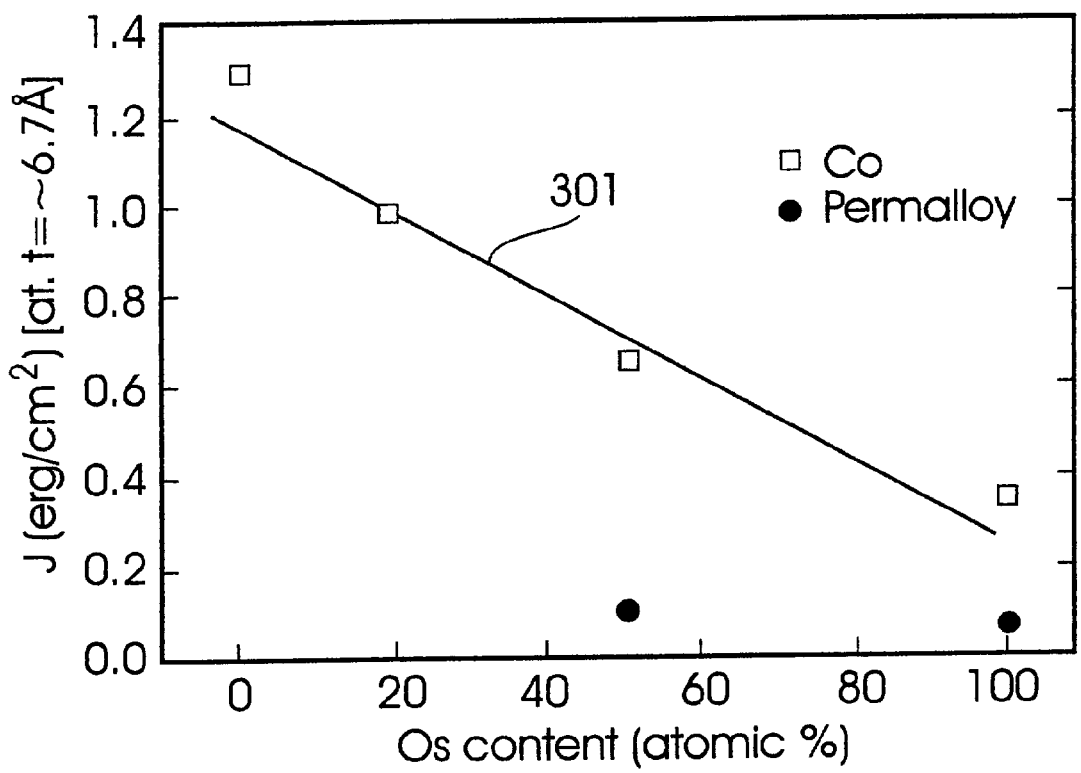
FIG. 4 is graph of coupling strength (J) versus atomic percent Os for laminated structures with Co and Ni—Fe ferromagnetic films and Ru—Os AFC films with varying amounts of Os.

Now referring to FIG. 4, line 301 plots the antiferromagnetic coupling strength (J) between Co ferromagnetic films (~20 Angstrom thick) in a thin multilayer structure versus percent Os in $Ru_{100-x}Os_x$ AFC films with x=0, 20, 50 and 100 atomic percent at a constant AFC film thickness of 6.7 Angstroms. The antiferromagnetic coupling strength between permalloy ferromagnetic films in a magnetic structure versus percent Os in $Ru_{100-x}Os_x$ AFC films with x=50 and 100 atomic percent at a constant AFC film thickness of 6.7 Angstroms is shown by the two data points. The antiferromagnetic coupling values for both Co and permalloy ferromagnetic films decrease approximately linearly with increases in atomic percent Os in the $Ru_{100-x}Os_x$ AFC films. FIG. 4 shows that controlled alloying of Ru with Os provides a method for controlling the antiferromagnetic coupling strength. Thus, controlled alloying of any combination of Os, Ru and Re when used as thin AFC films in magnetic devices provides a method for controlling the antiferromagnetic coupling. Additionally, there is a strong dependence on the antiferromagnetic coupling values with the type of magnetic material used in the ferromagnetic films. FIG. 4 also shows that the magnetic structure containing permalloy ferromagnetic films exhibit antiferromagnetic coupling values several times smaller than the corresponding structures with Co ferromagnetic films.

The alloying of Ru with Os is a means of reducing the saturation magnetic field of a laminated antiferromagnetically coupled structure. The actual reduction varies monotonically with increasing Os content. Moreover, the resistivity of Ru—Os alloys is higher than that of either Ru or Os. Thus Ru—Os alloys form a useful means of providing weaker, but still substantial, antiferromagnetic coupling between ferromagnetic films. Since Ru and Os have the same hcp crystalline structure and have similar lattice parameters and form a solid solution over their whole composition range, Ru—Os alloys are likely to have crystallographic properties similar to Ru.

Figure 5:
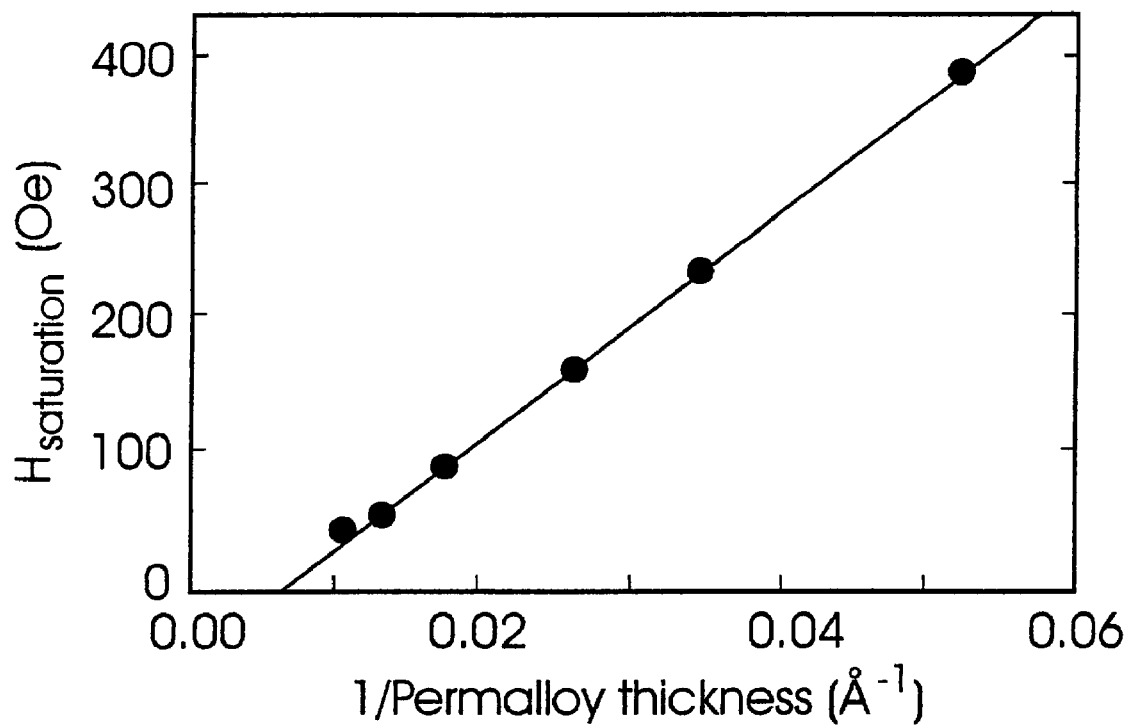
FIG. 5 is a graph of magnetization saturation field as a function of 1/permalloy thickness for laminated structures with permalloy ferromagnetic films and Os AFC films.
Figure 6:
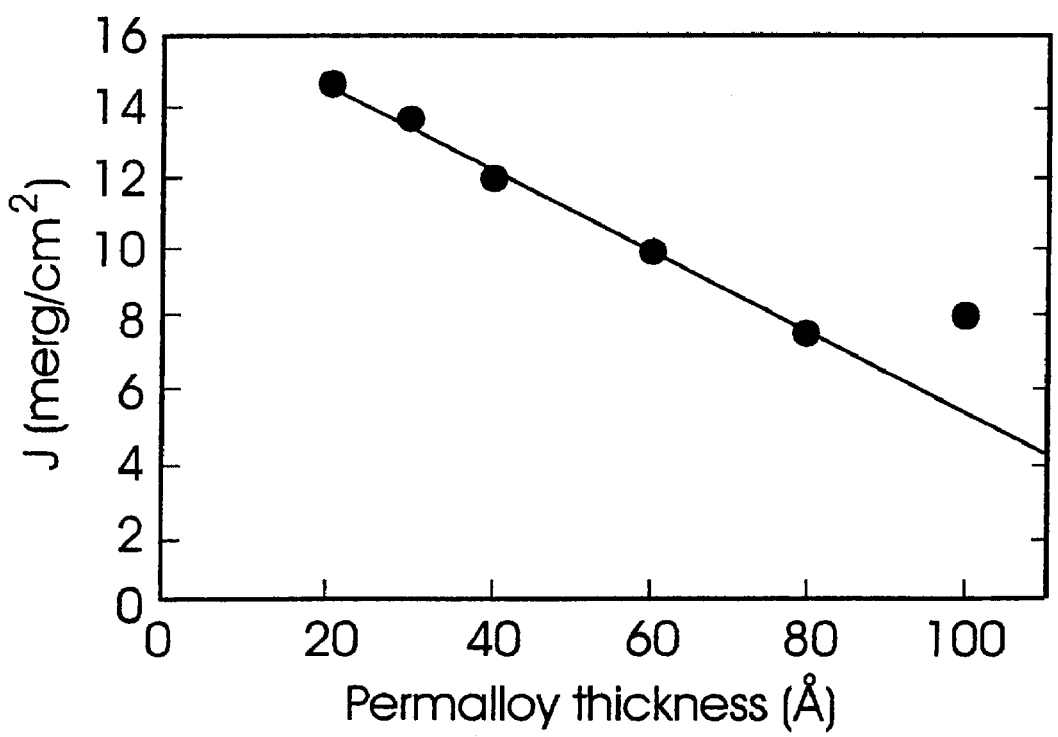
FIG. 6 is a graph of coupling strength (J) versus permalloy thickness for laminated structures with permalloy ferromagnetic films and Os AFC films.

FIG. 5 is a graph of the magnetization saturation field versus inverse permalloy thickness for magnetic structures with permalloy films and Os AFC films. FIG. 5 shows that the saturation magnetization field values are related approximately linearly with the reciprocal thickness of permalloy. These same data are used to extract values of coupling strength J in FIG. 6 using a saturation magnetization value for permalloy of ~800 emu/cm$^3$. FIG. 6 displays a graph of the antiferromagnetic coupling values in units of merg/cm$^2$ versus permalloy thickness for the laminated structure with permalloy ferromagnetic films and Os AFC films. Line 383 shows that the coupling strengths increase slightly with decreased thicknesses of the permalloy films. This is most likely because of a decrease in the magnetic moment of the thinner permalloy layers.

Although only the addition of Os has been described above, Ru can be alloyed with other elements to modify its antiferromagnetic coupling energy. For example, Ru can also be alloyed with Re, which has the same hcp structure as Ru and Os. Thus, the nonmagnetic AFC film is preferably made of an alloy with at least two elements selected from Os, Ru and Re, wherein preferred compositions are $Ru_{100-x}Os_x$, $Ru_{100-x}Re_x$, $Os_{100-x}Re_x$, with x>5 atomic percent with thicknesses ranging from approximately 2.5 to 100 Angstroms, with the thickness selected to assure antiferromagnetic coupling between the ferromagnetic films. The AFC film can also be formed of a ternary alloy of elements Os, Ru and Re with a preferred composition of $Os_{100-(x+y)}Re_xRu_y$ with (x+y)<40 atomic percent with thicknesses ranging from 2.5 to 100 Angstroms.

FIGS. 1 and 2 show magnetic devices where both the free and fixed ferromagnetic layers can be made with the laminated structures according to the present invention. However, it is within the scope of the present invention that either one or the other of the free and fixed ferromagnetic layers can be the laminated structure.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A magnetic device comprising:
   a pinned ferromagnetic layer having its magnetic moment fixed in a preferred direction in the absence of a magnetic field in the range of interest;
   a free ferromagnetic layer having its magnetic moment free to rotate relative to the moment of the pinned ferromagnetic layer in the presence of a magnetic field in the range of interest; and
   a nonmagnetic spacer layer located between and in contact with the pinned and free ferromagnetic layers; and wherein at least one of the fixed and free ferromagnetic layers comprises first and second ferromagnetic films antiferromagnetically coupled to one another and an antiferromagnetically coupling film located between and in contact with the first and second ferromagnetic films and having a thickness sufficient to couple the first and second ferromagnetic films together with their magnetic moments oriented antiparallel to one another, the antiferromagnetically coupling film being formed of an alloy selected from the group consisting of $Ru_{100-x}O_x$, $Ru_{100-x}Re_x$, $Os_{100-x}Re_x$ and $Os_{100-(z+y)}Re_zRu_y$ with x greater than 5 atomic percent and (z+y) less than 40 atomic percent.

2. The device of claim 1 wherein the magnetic device is a spin valve magnetoresistive sensor and the nonmagnetic spacer layer is formed of a metallic electrically conducting material.

3. The device of claim 1 wherein the magnetic device is a magnetic tunnel junction device and the nonmagnetic spacer layer is formed of an electrically insulating material.

4. A magnetic tunnel junction device comprising:
   a substrate;
   a fixed ferromagnetic layer having its magnetization direction fixed in a preferred direction in the absence of an applied magnetic field;
   an insulating tunnel barrier layer in contact with the fixed ferromagnetic layer; and
   a sensing ferromagnetic layer having its magnetization direction free to rotate relative to the magnetization direction of the fixed ferromagnetic layer and in contact with the insulating tunnel barrier layer; and wherein at least one of the fixed and sensing ferromagnetic layers comprises first and second ferromagnetic films antiferromagnetically coupled to one another and an antiferromagnetically coupling film located between and in contact with the first and second ferromagnetic films and having a thickness sufficient to couple the first and second ferromagnetic films together with their magnetic moments oriented antiparallel to one another the antiferromagnetically coupling film being formed of an alloy selected from the group consisting of $Ru_{100-x}Os_x$, $Ru_{100-x}Re_x$, $Os_{100-x}Re_x$ and $Os_{100-(z+y)}Re_zRu_y$ with x greater than 5 atomic percent and (z+y) less than 40 atomic percent.

5. The device of claim 4 wherein the device is a magnetic tunnel junction memory cell.

6. The device of claim 4 wherein the device is a magnetic tunnel junction magnetoresistive sensor.

7. A magnetoresistive spin valve sensor comprising:
   a substrate;
   a fixed ferromagnetic layer formed on the substrate and having its magnetization direction pinned in a preferred direction in the absence of an applied magnetic field;
   a nonmagnetic metallic electrically conducting spacer layer in contact with the fixed ferromagnetic layer; and
   a free ferromagnetic layer in contact with the spacer layer and having its magnetization direction free to rotate relative to the magnetization direction of the fixed ferromagnetic layer; and wherein at least one of the fixed and free ferromagnetic layers comprises first and second ferromagnetic films antiferromagnetically coupled to one another and an antiferromagnetically coupling film located between and in contact with the first and second ferromagnetic films and having a thickness sufficient to couple the first and second ferromagnetic films together with their magnetic moments oriented antiparallel to one another, the antiferromagnetically coupling film being formed of an alloy selected from the group consisting of $Ru_{100-x}Os_x$, $Ru_{100-x}Re_x$, $Os_{100-x}Re_x$ and $Os_{100-(z+y)}Re_zRu_y$ with x greater than 5 atomic percent and (z+y) less than 40 atomic percent.

* * * * *